US009312095B2

(12) United States Patent
Tripathi et al.

(10) Patent No.: US 9,312,095 B2
(45) Date of Patent: Apr. 12, 2016

(54) METHOD AND SYSTEM FOR AUTOMATING SAMPLE PREPARATION FOR MICROFLUIDIC CRYO TEM

(75) Inventors: Anubhav Tripathi, Northboro, MA (US); Jinkee Lee, Cranston, RI (US); Arjit Bose, Lexington, MA (US)

(73) Assignees: BROWN UNIVERSITY, Providence, RI (US); RHODE ISLAND BOARD OF EDUCATION, STATE OF RHODE ISLAND AND PROVIDENCE PLANTATIONS, Providence, RI (US)

( * ) Notice: Subject to any disclaimer, the term of this patent is extended or adjusted under 35 U.S.C. 154(b) by 65 days.

(21) Appl. No.: 13/070,902

(22) Filed: Mar. 24, 2011

(65) Prior Publication Data
US 2011/0238225 A1 Sep. 29, 2011

Related U.S. Application Data

(60) Provisional application No. 61/317,069, filed on Mar. 24, 2010.

(51) Int. Cl.
H01J 37/20 (2006.01)
(52) U.S. Cl.
CPC ......... *H01J 37/20* (2013.01); *H01J 2237/2001* (2013.01); *H01J 2237/208* (2013.01)
(58) Field of Classification Search
USPC .......................................................... 700/283
See application file for complete search history.

(56) References Cited

U.S. PATENT DOCUMENTS

| | | | | |
|---|---|---|---|---|
| 6,364,890 B1* | 4/2002 | Lum et al. | | 606/181 |
| 8,029,745 B2* | 10/2011 | Hunter et al. | | 422/515 |
| 8,071,049 B2* | 12/2011 | Koltay et al. | | 422/501 |
| 2002/0037269 A1* | 3/2002 | Liotta et al. | | 424/78.08 |
| 2003/0080143 A1* | 5/2003 | Kale et al. | | 222/1 |
| 2004/0072365 A1* | 4/2004 | Rose et al. | | 436/180 |
| 2004/0133288 A1* | 7/2004 | Hatcher et al. | | 700/56 |
| 2004/0157284 A1* | 8/2004 | Frederik et al. | | 435/40.5 |
| 2004/0267405 A1* | 12/2004 | Ingenhoven et al. | | 700/245 |
| 2006/0023201 A1* | 2/2006 | Malekafzali | | 356/36 |
| 2006/0027524 A1* | 2/2006 | Gilbert et al. | | 216/2 |
| 2006/0039823 A1* | 2/2006 | Yamakawa et al. | | 422/63 |
| 2006/0131269 A1* | 6/2006 | Aiba | | 216/66 |

(Continued)

OTHER PUBLICATIONS

Washburn, E. W. "The Dynamics of Capillary Flow" Phys. Rev. 1921.*

(Continued)

*Primary Examiner* — Ryan Jarrett
(74) *Attorney, Agent, or Firm* — Barlow, Josephs & Holmes, Ltd

(57) ABSTRACT

A method and system is provided for automatically preparing transmission electron microscopy (TEM) samples for examination by depositing extremely small samples onto a grid without need for a blotting step. A sample liquid droplet is formed at the end of a capillary, wherein a portion of the liquid is transferred to the TEM sample grid by contact. The excess volume in the liquid droplet is then retracted by an adjacent capillary. After a predetermined time interval, the retraction capillary is moved toward the drop of the sample to remove the excess volume. As compared to a conventional machine, where the blotting procedure can deform the structure of the molecule of interest, the present invention utilizes a very low shear rate for removal of the excess sample fluid.

8 Claims, 6 Drawing Sheets

(56) References Cited

U.S. PATENT DOCUMENTS

| | | | |
|---|---|---|---|
| 2006/0249671 A1* | 11/2006 | Karpetsky | 250/288 |
| 2008/0042058 A1* | 2/2008 | Schampers et al. | 250/307 |
| 2008/0185286 A1* | 8/2008 | Lehmann | 204/192.34 |
| 2009/0023607 A1* | 1/2009 | Rozhok et al. | 506/30 |
| 2009/0197008 A1* | 8/2009 | Kawakami | 427/475 |
| 2009/0230222 A1* | 9/2009 | Kim et al. | 239/690.1 |
| 2010/0089529 A1* | 4/2010 | Barholm-Hansen et al. | 156/247 |
| 2010/0279309 A1* | 11/2010 | Sui | 435/7.1 |
| 2010/0305747 A1* | 12/2010 | Agorio et al. | 700/213 |
| 2011/0107822 A1* | 5/2011 | Bunner et al. | 73/61.52 |
| 2011/0111981 A1* | 5/2011 | Love et al. | 506/10 |
| 2013/0053281 A1* | 2/2013 | Zarrine-Afsar et al. | B01L 3/06 506/30 |

OTHER PUBLICATIONS

Frederik, Peter. M. and Storms, Marc M.H. "Automated, Robotic Preparation of Vitrified Samples for 2D and 3D Cryo Electron Microscopy" Microscopy Today Nov. 2005.*

Melanson, Linda "A Versatile and Affordable Plunge Freezing Instrument for Preparing Frozen Hydrated Specimens for Cryo Transmission Electron Microscopy (CryoEM)" Microscopy Today Mar. 2009.*

Definition of "Aspirate" from Dictionary.com accessed Aug. 1, 2013.*

* cited by examiner

METHOD AND SYSTEM FOR AUTOMATING SAMPLE PREPARATION FOR MICROFLUIDIC CRYO TEM

CROSS-REFERENCE TO RELATED APPLICATIONS

This application is related to and claims priority from earlier filed U.S. Provisional Patent Application No. 61/317,069, filed Mar. 24, 2010, the contents of which are incorporated herein by reference.

GOVERNMENT LICENSE RIGHTS

This invention was made with government support under CBET0730392 awarded by National Science Foundation. The government has certain rights in the invention.

BACKGROUND OF THE INVENTION

The present invention relates generally to a method and system of preparing specimens for use in transmission electron microscopy (TEM). More specifically, the present invention relates to a method and system for automatically preparing TEM samples for examination by depositing extremely small samples onto a grid without need for a blotting step.

Transmission electron microscopy (TEM) is a microscopy technique whereby a beam of electrons is transmitted through an ultra-thin specimen such that the electron beam interacts with the specimen as it passes through. The interaction of the electrons transmitted through the specimen in turn creates an image. This created image is then magnified and focused onto an imaging device, such as a fluorescent screen, a layer of photographic film, or is detected by a sensor such as a CCD camera. The benefit is that TEM systems are capable of imaging at a significantly higher resolution than traditional light microscopes due to the small wavelength of the electron beams. This enables the instrument's user to examine fine detail, such as a single column of atoms, which is tens of thousands times smaller than the smallest resolvable object in a light microscope. TEM forms a major analysis method in a range of scientific fields, in both physical and biological sciences.

TEM specimens must be prepared and placed into gridded specimen holders to allow for insertion of the specimen holder into a vacuum column. The sample is placed onto the inner meshed area of the grid. Usual grid materials are copper, molybdenum, gold or platinum. This grid is placed into the sample holder which is paired with the specimen stage. A wide variety of designs of stages and holders exist, depending upon the type of experiment being performed.

The principal difficulty in the prior art is that sample preparation in TEM can be a complex procedure. TEM specimens are required to be at most hundreds of nanometers thick because the electron beam interacts readily with the sample, an effect that increases roughly with atomic number squared. High quality samples will have a thickness that is comparable to the mean free path of the electrons that travel through the samples, which may be only a few tens of nanometers. Preparation of TEM specimens is specific to the material under analysis and the desired information to obtain from the specimen. As such, many generic techniques have been used for the preparation of the required thin sections.

Materials that have dimensions small enough to be electron transparent, such as powders or nanotubes, can be quickly prepared by the deposition of a dilute sample containing the specimen onto support grids or films. The difficulty is that the deposition of these solutions generally results in the creation of a droplet that is too large and thick for sampling requiring that the sample be blotted. This is accomplished through the use of filter paper which introduces high shear to the specimen and is done at the expense of a great deal of time, both of which limit the ability to examine certain specimens and the formation of certain natural structures over time.

Once the specimen is deposited, in the biological sciences in order to withstand the instrument vacuum and facilitate handling, biological specimens can be fixated using either a negative staining material such as uranyl acetate or by plastic embedding. Alternately samples may be held at liquid nitrogen temperatures after embedding in vitreous ice. The biological material is spread on an electron microscopy grid and is preserved in a frozen-hydrated state by rapid freezing, usually in liquid ethane near liquid nitrogen temperature. By maintaining specimens at liquid nitrogen temperature or colder, they can be introduced into the high-vacuum of the electron microscope column.

There is therefore a need for an automated system for the preparation of a TEM sample. There is a further need for an automated system that automatically places and controls the size of a sample droplet formed in a TEM sample while eliminating the need for a blotting step. There is a further need for an automated system that automatically places and controls the size of a sample droplet formed in a TEM sample while eliminating the need for a blotting step in a manner that accelerates the preparation process thereby allowing previously unobserved structures to be viewed.

BRIEF SUMMARY OF THE INVENTION

In this regard, the present invention provides a method and system of preparing specimens for use in transmission electron microscopy (TEM). More specifically, the present invention provides a method and system for automatically preparing TEM samples for examination by depositing extremely small samples onto a grid without need for a blotting step.

Most generally, the present invention provides a method and system for the formation of a sample liquid droplet at the end of a capillary, wherein a portion of the liquid is transferred to the TEM sample grid by contact. The excess volume in the liquid droplet is then retracted by an adjacent capillary. The flow rate of injection/retraction and the growth of the drop on the capillary tip are initially evaluated to tune the starting time of the retraction capillary motion. After a predetermined time interval, the retraction capillary is moved toward the drop of the sample to remove the excess volume. As compared to a conventional machine, where the blotting procedure can deform the structure of the molecule of interest, the present invention utilizes a very low shear rate for removal of the excess sample fluid.

Once the sample is deposited and retracted the grid is then be plunged into liquid ethane to vitrify the sample. By eliminating the blotting step and controlling flow rates and residence times in the micro channels, the system of the present invention can facilitate the direct visualization of aggregates that are formed within the ten to hundred millisecond time scales. All of the operation described here will be controlled by a computer, allowing very accurate knowledge of microstructure age at the time of freezing. This device will represent a unique window for the examination of the temporal evolution of aggregate morphologies.

It is therefore an object of the present invention to provide an automated system for the preparation of a TEM sample. It is a further object of the present invention to provide an automated system that automatically places and controls the size of a sample droplet formed in a TEM sample while eliminating the need for a blotting step. It is still a further object of the present invention to provide an automated system that automatically places and controls the size of a sample droplet formed in a TEM sample while eliminating the need for a blotting step in a manner that accelerates the preparation process thereby allowing previously unobserved structures to be viewed.

These together with other objects of the invention, along with various features of novelty which characterize the invention, are pointed out with particularity in the claims annexed hereto and forming a part of this disclosure. For a better understanding of the invention, its operating advantages and the specific objects attained by its uses, reference should be had to the accompanying drawings and descriptive matter in which there is illustrated a preferred embodiment of the invention.

BRIEF DESCRIPTION OF THE DRAWINGS

In the drawings which illustrate the best mode presently contemplated for carrying out the present invention.

DETAILED DESCRIPTION OF THE INVENTION

Figure 1:
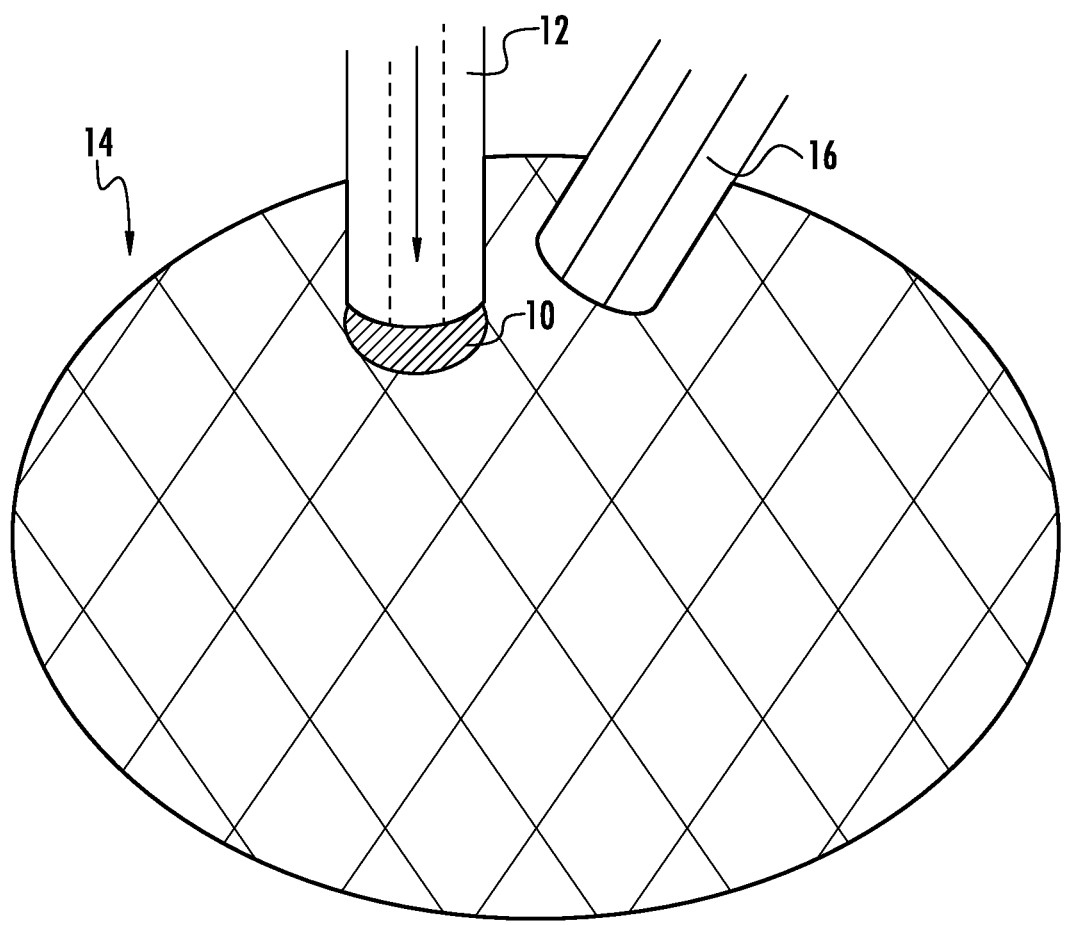
FIG. 1 is an enlarged view of the fluid deposition system and method of the present invention wherein a fluid droplet is formed at the end of the deposition capillary.

Now referring to the drawings, the present invention can be seen to provide a method and system of preparing transmission electron microscopy (TEM) samples for examination by depositing extremely small samples onto a grid without need for a blotting step. As best shown at FIG. 1, the present invention generally provides a method and system for the formation of a sample liquid droplet 10 at the end of a capillary 12, wherein a portion of the liquid 10 is transferred to the TEM sample grid 14 by direct contact of the droplet 10 therewith. The excess volume in the liquid droplet is then retracted by an adjacent capillary 16. The flow rate of injection/retraction and the growth of the drop on the capillary tip are initially evaluated to tune the starting time of the retraction capillary motion. After a predetermined time interval, the retraction capillary is moved toward the drop of the sample to remove the excess volume. As compared to a conventional machine, where the blotting procedure can deform the structure of the molecule of interest, the present invention utilizes a very low shear rate for removal of the excess sample fluid.

In connection with cryo-TEM processes, once the sample is deposited and retracted the grid is then be plunged into liquid ethane to vitrify the sample. By eliminating the blotting step and controlling flow rates and residence times in the micro channels, the system of the present invention can facilitate the direct visualization of aggregates that are formed within the ten to hundred millisecond time scales. All of the operation described here will be controlled by a computer, allowing very accurate knowledge of microstructure age at the time of freezing. The range of applicability of the present microfluidic-cryo-TEM device disclosed herein serves to (1) eliminate the blotting step during sample preparation; (2) automate the positioning of the capillary deposition device with the sample grid; and (3) integrate the microfluidic device inside the CEVS box.

Figure 2:
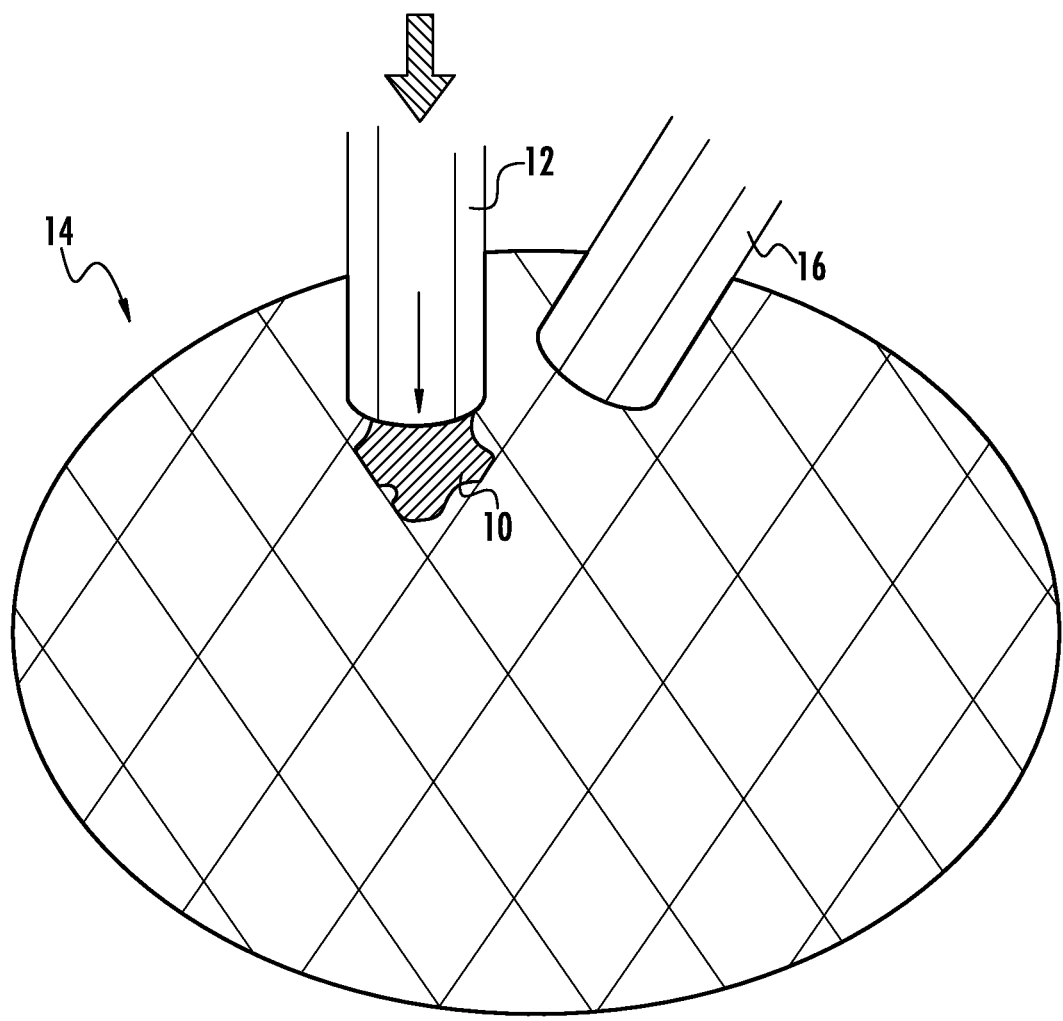
FIG. 2 is an enlarged view of the fluid deposition system and method of the present invention wherein a fluid droplet is brought into contact with the TEM sample grid by the deposition capillary.
Figure 3:
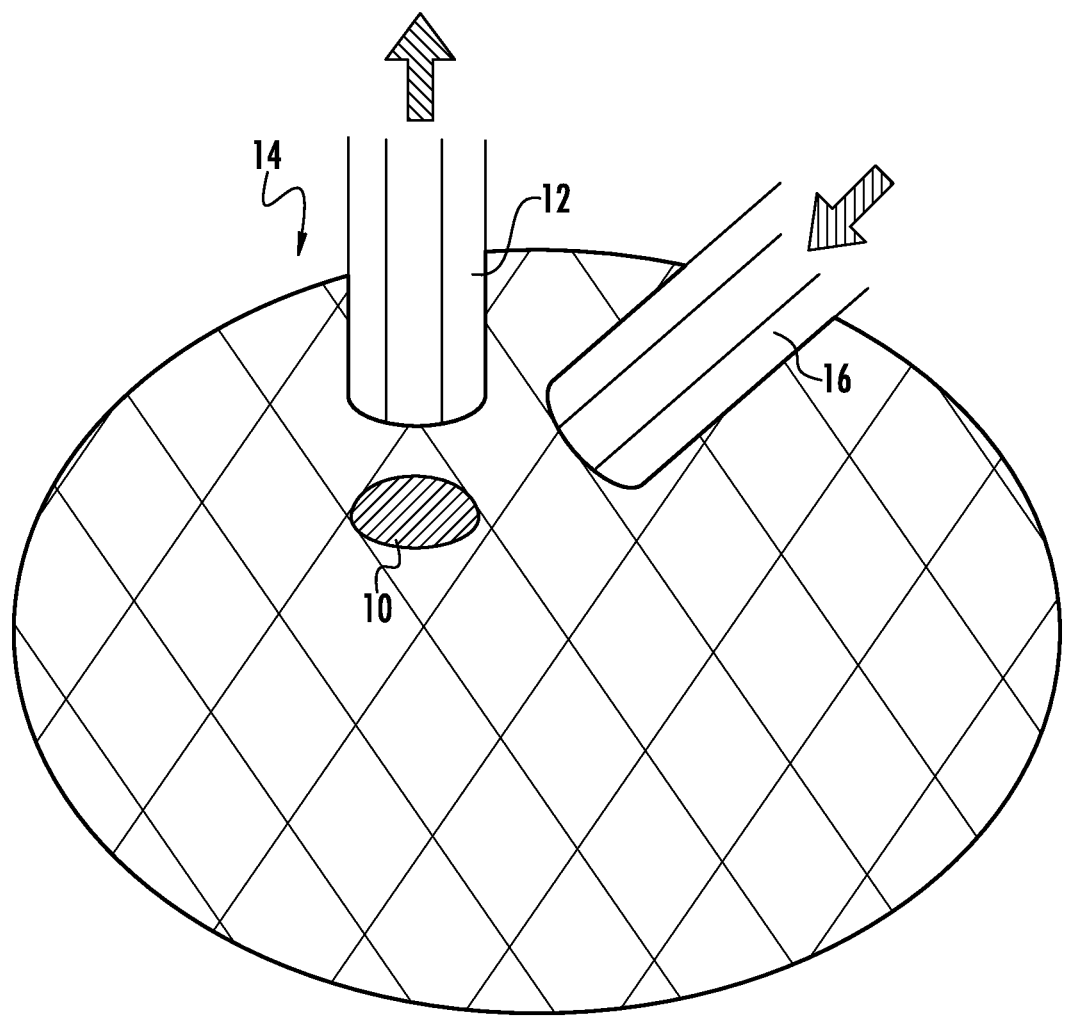
FIG. 3 is an enlarged view of the fluid deposition system and method of the present invention wherein a fluid droplet remains on the TEM sample grid as the deposition capillary is withdrawn.
Figure 4:
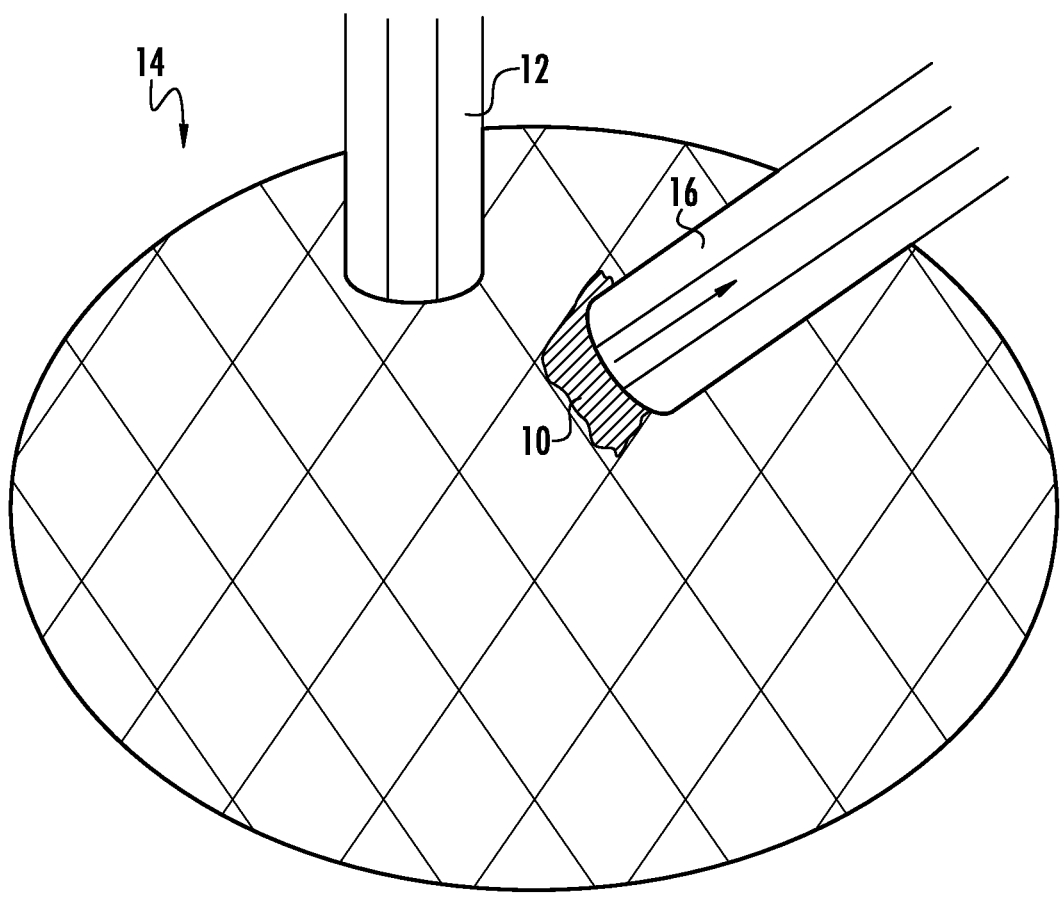
FIG. 4 is an enlarged view of the fluid deposition system and method of the present invention wherein a retraction capillary is brought into contact with the fluid droplet.
Figure 5:
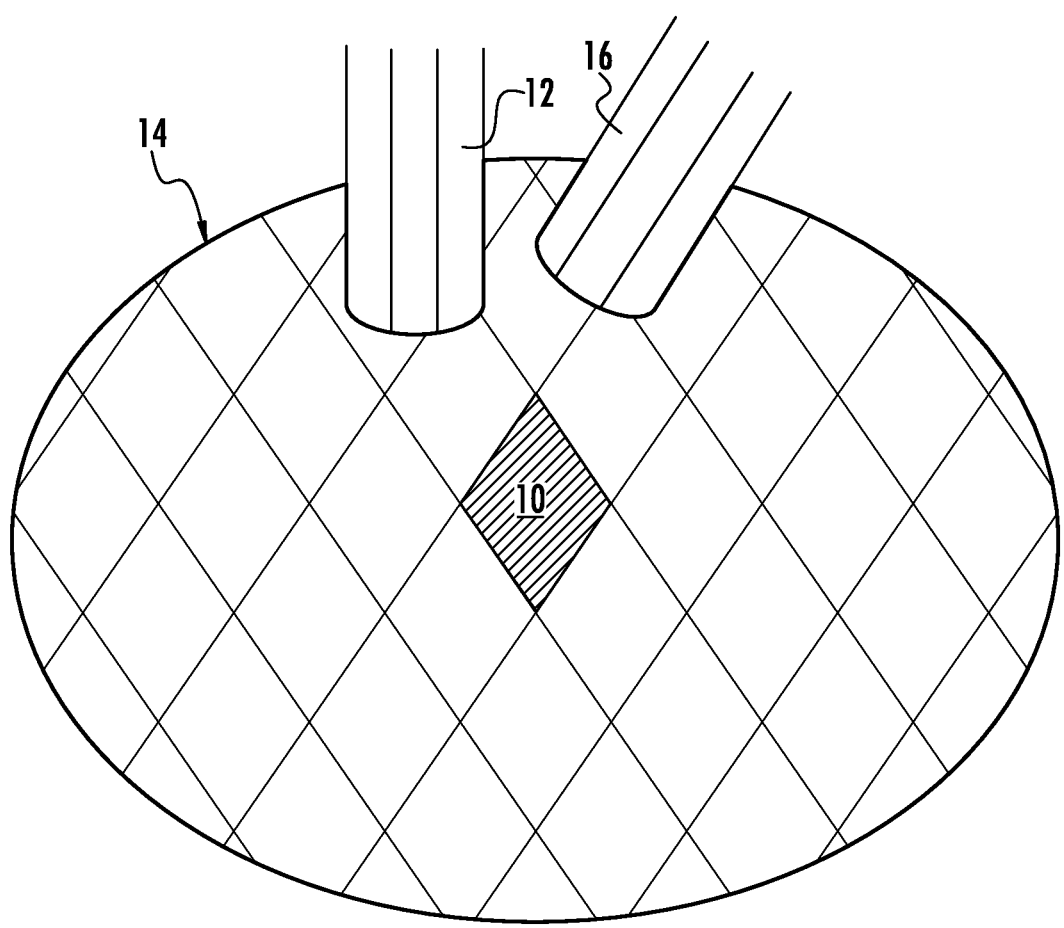
FIG. 5 is an enlarged view of the micro fluidic sample remaining on the TEM sample grid after the capillaries are withdrawn.

As was stated previously, in sequential operation the method of the present invention is particularly illustrated at FIGS. 1-5. In operation as seen at FIG. 1, the depositing capillary 12 allows a flow that created a fluid droplet 10 at the end thereof. In FIG. 2, the depositing capillary 12 is brought into contact with the sample grid 14 leaving the sample droplet 10 thereon. At FIG. 3 the depositing capillary 12 is withdrawn and the retracting capillary 16 is extended. At FIG. 4, when the retracting capillary 16 comes into contact with the droplet 10, excess fluid is drawn into the retracting capillary 16. As shown at FIG. 5, both the depositing capillary 12 and the retracting capillary 16 have been withdrawn leaving a microfluidic sample 10 on the EM sample grid 14. This process is then repeated automatically as necessary for any additional cells on the TEM sample grid 14.

The system operation is monitored and carefully controlled via computer so as to optimize the gap between grid 14 and retracting capillary 16 and its velocity (time of contact) will be optimized. The flow rate of injection/retraction and the growth of the drop 10 on the depositing capillary 12 tip are evaluated to tune the starting time of retraction capillary 16 motion. After a predetermined time interval (this time is dictated by the required temporal resolution), the retraction capillary 16 is moved as shown at FIGS. 3 and 4 toward the drop 10 of the sample and remove the excess volume. The system employs an automated XYZ positioning system that positions the deposition capillary 12 and controls the contact time control between liquid 10 from deposition capillary 12 to the cryo-TEM sample grid 14. An alignment camera may also be used for alignment feedback control. Once the meniscus of the droplet 10 from the deposition capillary 12 touches the grid 14, as shown in FIG. 2, the retracting capillary 16 moves forward as shown at FIGS. 3 and 4 to grid 14 to remove the excess fluid 10.

Upon deposition onto the grid 14 the liquid ejecting from the deposition capillary 12 should spread easily on the grid 14. Preferably the grid is made hydrophilic to enhance the spread of the liquid samples. By eliminating the blotting step and controlling flow rates and residence times in the micro channels of the capillaries it is expected that direct visualization of aggregates that are formed within the ten to hundred millisecond time scales can be achieved. All of the operation described here will be controlled by a computer, allowing very accurate knowledge of microstructure age at the time of freezing. This device will represent a unique window for the examination of the temporal evolution of aggregate morphologies.

Figure 6:
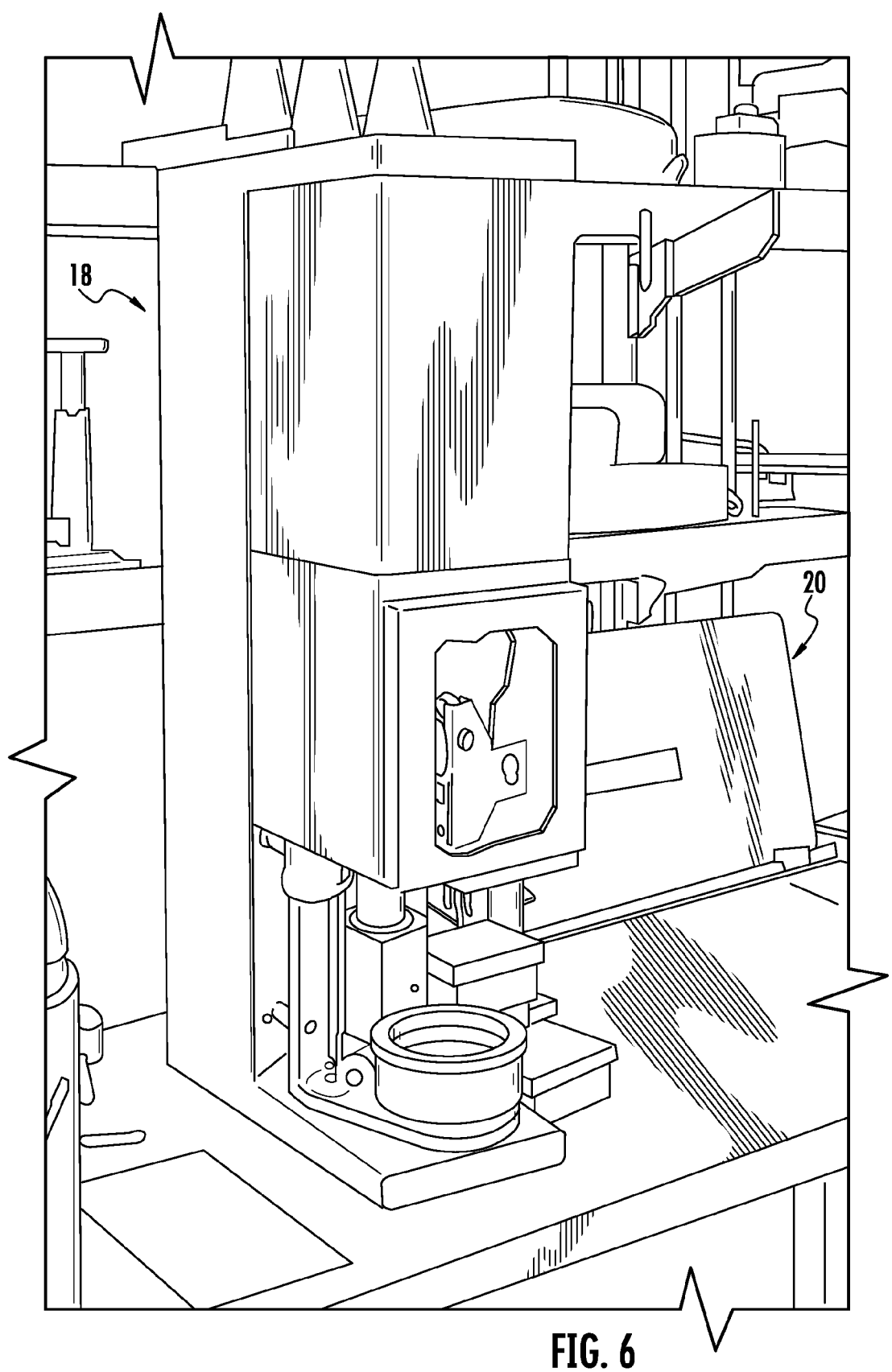
FIG. 6 is a view of an overall system incorporating the fluid deposition system and method of the present invention.

As can be seen at FIG. 6 the microfluidic device of the present invention may be incorporated into the CEVS box 18 controlled by a computer 20. A judiciously designed microfluidic setup offers a unique opportunity to rapidly screen the short and long time scale formation of nanomaterials, soft colloids and vesicles. The key feature that permits this is the laminar flow of the sample fluids in the capillary 12, 16 channels, diffusive transport in a direction orthogonal to the flow, and the small volumes that are processed allowing the temperature to equilibrate easily. The mixing of two solutions decreases as the magnitude of the flow increases relative to the diffusional flow across the channel. The convective and diffusional transport of the supramolecules can be described using a Peclet number. The Peclet number can be varied from below 1 to above 1 by manipulating the flow rates in the channels. This allows control over extent of diffusive mixing in the channel. The images will provide a fundamental basis to understanding the effects of concentration, pre-shear and mixing time on structure and homogeneity.

Using this new microfludic integrated cryo-TEM CEVS, the structure formation during precipitation/crystallization of inorganic and hybrid systems will be explored. Supplying the starting materials necessary for the initiation of solid-state formation (be it via nucleation, spinodal composition or interfacial reactions) into the microfluidics device allows for the tracking of the reaction and structure formation at the interface between the two laminar streams along the flow channel. When two supersaturated solutions are mixed from their reservoirs, crystal formation initiates at the plane common to the two solutions in the microfluidic channel. Structures formed there will be examined directly by cryo-TEM using the computer-controlled setup developed. Since this is a flowing system, and crystals form only at the zone where there is sufficient 'contact' between the two solutions, there is no danger of plugging the microchannels. The concentrations, relative flow rates of each feed solution and the residence time in the channel will be controlled to allow us to examine a very wide range of conditions quite easily. Our new TEM system, which allows low-dose capability, will permit diffraction studies to be performed easily, so that the crystalline nature of any of the precursor phases can be examined. In crystalline phases, we will look closely for polymorphs.

Furthermore, the influence of water-soluble polymers (for example polycarboxylic acids) on the structural evolution will be studied. It is known that polymers exhibit a range of modes-of-action, such as complexation, stabilization, flocculation. The role of additives will be explored using such a system, by adding a reservoir containing the additive and controlling the flow rate from this reservoir. Only by means of time-resolved experiments is it possible to unequivocally track down these mechanisms to their molecular origin.

Finally, it is possible to examine particle formation in organic systems. This field is of great importance since half of the presently synthesized active pharmaceutical ingredients (API) are too hydrophobic to be applied in standard formulations. One approach to improve the bioavailability is too reduce the size of the primary API particles and thus to increase the solubility. Again, nanoparticle formation during precipitation can be studied with the unique approach—combining microfluidics and cryo-TEM—as a well known hydrophobic active shall be used to study particle formation and the influence of stabilizing agents, such as copolymers.

It can therefore be seen that the present invention provides an automated system for the preparation of a TEM sample that automatically places and controls the size of a sample droplet formed while eliminating the need for a blotting step. Further, the present invention provides an automated system that automatically places and controls the size of a sample droplet formed in a TEM sample while eliminating the need for a blotting step in a manner that reduces shear induced in the sample and accelerates the preparation process, thereby allowing previously unobserved structures to be viewed. For these reasons, the instant invention is believed to represent a significant advancement in the art, which has substantial commercial merit.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed:

1. A method of preparing a cryogenic transmission electron microscopy sample grid, comprising:
   providing a sample carrier grid having nanoscale sample openings;
   forming a fluid droplet at the end of a first capillary;
   bringing said droplet into contact with a top surface of said carrier grid thereby depositing said droplet onto said top surface; and
   bringing a second capillary onto contact with said droplet to withdraw a portion of the fluid from said droplet to form a microfluidic sample on said top surface,
   wherein said steps of forming a fluid droplet, bringing the droplet into contact with a top surface and bringing a second capillary into contact with the droplet are controlled using a computer.

2. The method of claim 1, further comprising:
   after withdrawing a portion of said fluid, freezing said carrier grid with said microfluidic sample thereon.

3. The method of claim 1, wherein the computer controls an automated XYZ positioning system that positions the first capillary and controls a contact time between the fluid droplet and the top surface.

4. The method of claim 1, wherein the top surface of said carrier grid is hydrophilic.

5. A system for preparing a cryogenic transmission electron microscopy sample grid, comprising:
   an automatic controller;
   a first capillary for depositing fluid samples onto a sample carrier grid having nanoscale sample openings;
   a second capillary for withdrawing a portion of said fluid samples; and
   an automated XYZ positioning controller in communication with said automatic controller, said XYZ positioning controller controlling the position of said first and second capillaries,
   wherein said automatic controller controls said first and second capillaries by,
      forming a fluid droplet at the end of said first capillary;
      bringing said droplet into contact with a top surface of a carrier grid thereby depositing said droplet onto said top surface; and
      bringing said second capillary onto contact with said droplet to withdraw a portion of the fluid from said droplet to form a microfluidic sample on said top surface.

6. The system of claim 5, further comprising: said automatic controller controlling freezing said carrier grid with said microfluidic sample thereon.

7. The system of claim 5, wherein said automatic controller controls said automated XYZ positioning controller to position the first capillary and control a contact time between the fluid droplet and the top surface.

8. The system of claim 5, wherein the top surface of said carrier grid is hydrophilic.

* * * * *